United States Patent

[11] 3,585,631

[72] Inventor Rainer F. McCown
Woodbridge, Va.

[21] Appl. No. 880,142
[22] Filed Nov. 26, 1969
[45] Patented June 15, 1971
[73] Assignee Westinghouse Electric Corporation
Pittsburgh, Pa.

[54] SQUARE LAW ANALOG-TO-DIGITAL CONVERTER
6 Claims, 1 Drawing Fig.

[52] U.S. Cl. .......... 340/347, 307/235
[51] Int. Cl. .......... H03k 13/175
[50] Field of Search .......... 340/347; 307/235

[56] References Cited

UNITED STATES PATENTS

| | | | |
|---|---|---|---|
| 3,221,324 | 11/1965 | Margopoulos .......... | 340/347 |
| 3,277,462 | 10/1966 | Sekimoto .......... | 340/347 |
| 3,315,251 | 4/1967 | Kaneko .......... | 340/347 |
| 3,458,721 | 7/1969 | Maynard .......... | 307/235 |
| 3,508,250 | 4/1970 | Wells .......... | 340/347 |

*Primary Examiner*—Maynard R. Wilbur
*Assistant Examiner*—Michael K. Wolensky
*Attorneys*—F. H. Henson and E. P. Klipfel

ABSTRACT: A plural stage analog-to-digital converter with a square law transfer characteristic is described. The converter comprises in a typical embodiment three identical stages with the first stage having a fixed reference voltage applied thereto. More or less stages can be used as desired. A pair of identical resistive ladder networks having the resistors thereof arranged in quadratic fashion is employed in each of the stages of the converter. The ladder networks of the first stage divide the fixed reference voltage applied to the first stage into a plurality of voltages each of predetermined magnitude. A plurality of comparators is employed in each stage to compare a divided reference voltage applied to the respective stages with an unknown analog input signal which is also applied to each stage. The reference voltages for the second stage are obtained from the first stage and the reference voltages for the third stage are obtained from the second stage. A decoder is coupled to each stage of the converter for deriving an output representative of the square of the level of the analog signal applied to the converter.

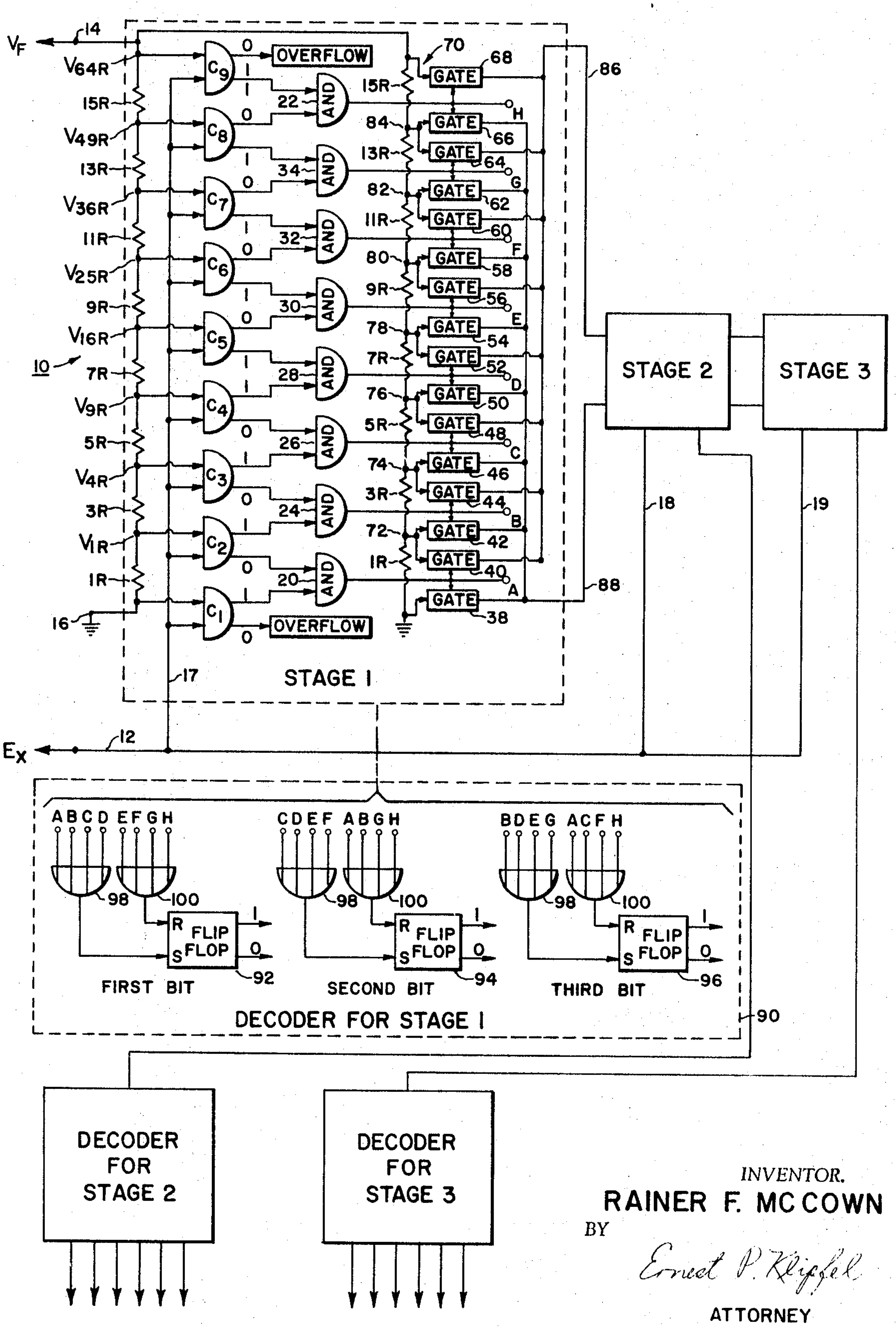
INVENTOR.
RAINER F. MC COWN
BY
Ernest P. Klipfel
ATTORNEY

SQUARE LAW ANALOG-TO-DIGITAL CONVERTER

BACKGROUND OF THE INVENTION

This invention relates to analog-to-digital converters and more particularly to analog-to-digital converters with square law transfer characteristics.

It may be explained that a nonlinear transfer characteristic in an analog-to-digital converter has heretofore required the use of two circuits. In the first circuit, the input or analog signal was converted by the desired transfer function and the converted signal was then applied to a second circuit, namely, a linear analog-to-digital converter, to obtain the desired digital output.

The use of two circuits in such a manner is undesirable because two accurate circuits must be employed and because the output accuracy of a nonlinear function is often specified nonlinearly also.

SUMMARY OF THE INVENTION

Briefly, the present invention provides in a single circuit a nonlinear analog-to-digital converter. The converter of the present invention employs a plurality of stages connected in parallel with each other and the first stage of the converter has a fixed reference voltage source applied thereto. Circuit means are provided for applying an input analog signal to each of the stages of the converter. At least the first and second stages of the converter each has a first resistive ladder network connected in parallel with a second identical resistive ladder network. The first and second resistive ladder networks of the first stage are connected across the reference voltage source applied to the first stage for dividing the reference voltage source into a plurality of voltages each of predetermined magnitude. The first stage of the converter has a plurality of comparator devices operatively connected to the first ladder network thereof which is also adapted for connection to the input analog signal. The comparators of the first stage are arranged to compare the input analog signal with the plurality of voltages. First means are provided which are operatively connected to the outputs of the comparators of the first stage and adapted to select the voltage levels of the plurality of voltages between which the input analog signal falls. Second means are provided which are operatively connected to the first means and the second resistive ladder network of the first stage for interconnecting that portion of the second resistive ladder network of the first stage across the first ladder network of the second stage of the converter whereby the selected levels of said plurality of voltages between which the input signal falls are supplied to the second stage of the converter. Finally, means are coupled to each stage of the converter to derive a digital output representative of the analog input signal.

Preferably, the resistors employed in the ladder networks of the various stages of the converter are arranged in quadratic fashion such that the last-named means coupled to each stage of the converter derives a digital output representative of the square of the analog input signal.

The invention will become more clearly apparent after the study of the following description when read in connection with the accompanying drawing which forms a part of this specification.

BRIEF DESCRIPTION OF THE DRAWING

The accompanying drawing is a circuit diagram, partially in block form, of an embodiment of the present invention.

DESCRIPTION OF THE PREFERRED EMBODIMENT

Referring to the drawing, there is shown, in accordance with the invention, a basic form of an analog-to-digital converter with a square law transfer characteristic. The converter comprises three identical stages which are designated as stage 1, stage 2 and stage 3. As each of the stages are identical, only the first has been shown in detail for purposes of simplicity. As will become more apparent hereinafter, the converter illustrated in the drawing can be characterized as a 9-bit nonlinear analog-to-digital converter wherein a continuous signal, the analog signal, is quantized nonlinearly. The first stage quantizes the analog signal to obtain the three most significant bits; the second stage quantized the signal to obtain the next three bits; and the third stage quantized the signal to obtain the remaining three bits.

As shown, stage 1 comprises a resistive ladder network, designated generally at 10. A fixed direct current reference voltage source $V_F$ is applied across the terminals 14 and 16 of the ladder network 10. In accordance with the invention, the resistors making up the ladder network 10 are arranged nonlinearly, and in this case, are arranged in quadratic fashion as shown so as to develop a plurality of direct current reference voltages, $V_{1R}$ through $V_{64R}$ increasing as shown. The direct current reference voltages $V_{1R}$ through $V_{64R}$, respectively, comprise input voltages to one of each of the input terminals of a bank of threshold or comparator devices, designated as $C_1$ through $C_9$. The other input terminal of each comparator is driven by the unknown input analog voltage $E_X$ which is to be quantized. The analog signal $E_X$ is applied to the converter via lead 12 and is supplied to all three stages of the converter via leads 17, 18 and 19.

The comparators $C_1$ through $C_9$ form no part of the invention per se and are shown in block form for purposes of simplicity. Any conventional comparator device may be employed. The function of the comparators is to compare the unknown voltage, the analog signal, with the reference voltages to determine which of the two signals is larger. Based on this decision, a digital number is derived to describe the range of the analog signal. In this case, due to the quadratic arrangement of the resistors making up the ladder network, a digital number representing the square of the level of the analog signal is derived. Basically, each of the comparators is a thresholding device having two output terminals which are controlled by the relative magnitude of the reference voltage and the unknown signal being measured.

In this case, if the unknown analog signal $E_X$ is larger than the reference voltage applied to a particular comparator device, a logic 1 signal will appear on the upper output terminal of that comparator and a logic 0 signal will appear on the lower output terminal thereof. If, on the other hand, the analog signal $E_X$ is smaller than the reference voltage applied to a particular comparator device, a logic 0 signal will appear on the upper output terminal of that comparator and a logic 1 signal will appear on the lower output terminal thereof.

As shown, one output terminal of each of the comparators $C_1$ and $c_9$ is connected to a conventional OVERFLOW device, which, for example, may be an impedance or alarm device which is operated when the unknown analog signal exceeds the limits of the reference voltage source $V_F$. In such an instance, no digital output is derived from the converter. Each of the other terminals of the comparators $C_1$ and $C_9$ is connected to one input terminal of the conventional AND circuits 20 and 22, respectively.

The output terminals of comparator $C_2$ are connected to AND circuit 20 and AND circuit 24. The output terminals of comparator $C_3$ are connected to AND circuit 24 and AND circuit 26. The output terminals of comparator $C_4$ are connected to AND circuit 26 and AND circuit 28. The output terminals of comparator $C_5$ are connected to AND circuits 28 and 30. The output terminals of comparator $C_6$ are connected to AND circuits 30 and 32. The output terminals of comparator $C_7$ are connected to AND circuits 32 and 34. The output terminals of comparator $C_8$ are connected to AND circuits 34 and 22.

The output terminals of each of the AND circuits are designated A through H. The output terminals A—H, respectively, are each connected to two conventional gate devices. The output terminal A is connected to the gate devices 38 and 40; terminal B is connected to gates 42 and 44; terminal C to gates 46 and 48; terminal D to gates 50 and 52; terminal E to gates 54 and 56; terminal F to gates 58 and 60; terminal G to gates 62 and 64; and terminal H to gates 66 and 68.

A second ladder network shown generally at 70, is provided in stage 1 of the converter which is identical to the ladder network 10. The network 70 is connected in parallel with the network 10. The junction points 72 through 84, respectively, of the network 70 are connected respectively to the input terminals of the respective pairs of gates 40, 42; 44, 46; 48, 50; 52, 54; 56, 58; 60, 62; and 64, 66. The input terminal of gate 38 is connected to ground and the input terminal of gate 68 is connected to terminal 14.

The output terminals of the gates 40, 44, 48, 52, 56, 60, 64 and 68 are connected to a common lead 86 which, in turn, is connected to the upper terminal of the first ladder network of the second stage of the converter. The output terminals of the gates 38, 42, 46, 50, 54, 58, 62 and 66 are connected to a common lead 88 which, in turn, is connected to the lower terminal of the first ladder network of stage 2. The arrangement is such that stage 1 is connected in parallel with stage 2. As each of the stages are identical, it will be understood that the three stages of the converter are connected in parallel.

The output terminals A—H of stage 1 are also connected to a decoder circuit for stage 1. The decoder for stage 1 is shown in block form at 90. The decoder circuits for each of the stages of the converter are identical and only the decoder for stage 1 has been illustrated for purposes of simplicity.

The decoder 90 comprises three conventional flip-flop circuits 92, 94 and 96, respectively. Each flip-flop has associated therewith a pair of conventional OR circuits 98 and 100. The output terminals A—H are connected to the input terminals of the respective OR circuits in the manner shown as represented by the line symbols A—H appearing above the input terminals of the OR circuits. Each of the OR circuits 98 is connected to the set terminal S and each of the OR circuits 100 is connected to the reset terminal R of the flip-flops. As will be understood to those skilled in the art, the arrangement of the decoder 90 will permit eight unique levels to be represented in three-bit logic code form on either of the upper or lower output terminals of the respective flip-flops. That is, eight unique three-bit words in logic code form may be represented in the decoder 90. As will appear more fully hereinafter, each unique three-bit word produced in decoder 90 represents the three most significant bits of the square of the level or range of the input applied signal applied to stage 1 of the converter.

Having thus described the circuit elements employed in a converter according to the invention, the operation thereof will now be set forth.

As shown, the analog signal $E_X$ is applied directly to the banks of comparators of the respective stages. Each comparator in each bank assumes one of two states depending on the value of the analog signal. If the input signal is changing rapidly, the comparator states also change rapidly and effectively follow the input signal.

In stage 1, if each of the lower output terminals of comparators $C_2$—$C_8$ has a logic 1 signal thereon, the analog signal must be less than $V_{1R}$ and must, therefore, be between ground level and $V_{1R}$. When each of the upper output terminals of all the comparators $C_2$—$C_8$ has a logic 1 signal thereon, the analog signal must be between $V_{49R}$ and $V_F$ which is the fixed reference voltage applied across the terminals 14 and 16.

Similarly, as each of the comparators $C_2$—$C_8$ has a particular reference voltage applied thereto, the level or range of the analog signal can be specifically defined as determined by the output states of the comparators $C_2$—$C_8$. For example, assuming the input analog signal to be larger than $V_{9R}$ but less than $V_{16R}$, then, as illustrated in the drawing, each of the comparators $C_2$—$C_4$ will have a logic 1 signal output appear on their upper terminals with the lower terminals of each having a logic 0 signal appear thereon. Moreover, the comparators $C_5$ through $C_8$ will have a logic 0 signal appear on their upper terminals with the lower terminals of each having a logic 1 signal appear thereon.

Now continuing with the operation of stage 1, the AND gates select the levels between which the analog input signals fall. Only one of the AND gates will be triggered for any one level or range of the analog input signal. In the above example where the analog signal was assumed to be greater than $V_{9R}$ but less than $V_{16R}$, the comparators $C_2$—$C_4$ had a logic 1 signal appear on each of the upper terminals thereof and the comparators $C_5$ through $C_8$ had a logic 1 signal appear on each of the lower terminals thereof. Consequently, only the AND gate 28 will have logic 1 signals applied to both of its input terminals which, of course, results in a logic 1 signal appearing on its output terminal D. The logic 1 signal appearing on the output terminal D is converted into a three-bit word by the decoder 90 of stage 1, which binary word represents the square of the level or range of the analog signal as determined in stage 1. This same logic 1 signal appearing on output terminal D is effective to open the gates 50 and 52 to apply the fixed reference voltages for the second stage. In the present example, these reference voltages are the same as those of the comparators $C_4$ and $C_5$, which surround the analog input signal, namely, $V_{9R}$ and $V_{16R}$. It can thus be seen that whenever a logic 1 signal appears on any of the output terminals A—H, the pair of gates surrounding the particular terminal on which the logic 1 signal appears is opened to apply the fixed reference voltages for the second stage of the converter.

Operation of stages 2 and 3 of the converter is the same as the first, except that the fixed reference voltages for the comparators of stage 2 are obtained from stage 1 and the fixed reference voltages for the comparators of stage 3 are obtained from stage 2.

Each of the three-bit words obtained by the respective decoders for stages 1, 2 and 3 results in a 9-bit word for parallel readout. The 9-bit word obtained for any one level of the analog input signal in the embodiment described would represent the square of the one level of the analog input signal.

The analog-to-digital converter described is adaptable to a two-channel system such as, sine and cosine, where the outputs would be added to remove all phase variations and beat signals. Another application for a nonlinear converter is in data compression to ease storage problems. While the converter of the present invention has been particularly described as a converter with a square law transfer characteristic, it is to be understood that like systems can be constructed with other transfer characteristics, such as a logarithmic characteristic. In addition, the transfer characteristics of the converter can also be made programmable if an adjustable transfer function is desired.

Thus, while the invention has been shown in but one form, it will be obvious to those skilled in the art that it is not so limited, but is susceptible of various other changes and modifications without departing from the spirit thereof.

I claim as my invention:

1. A plural stage analog-to-digital converter wherein each of the stages of said converter are connected in parallel with each other and the first stage of said converter has a fixed reference voltage source applied thereto, circuit means for applying an input analog signal to each of said stages, at least the first and second stages of said converter each having a first resistive ladder network connected in parallel with a second identical resistive ladder network, said first and second resistive ladder networks of said first stage being connected across said reference voltage source for dividing said reference voltage source into a plurality of voltages each of predetermined magnitude, said first stage of said converter having a plurality of comparator devices operatively connected to the first resistive ladder network thereof and also operatively connected to said input analog signal circuit means, said comparators of said first stage being arranged to compare said input analog signal with said plurality of voltages, first means operatively connected to the outputs of said comparators of said first stage and adapted to select the voltage levels of said plurality of voltages between which said input analog signal falls, second means operatively connected to said first means and said second resistive ladder network of said first stage for interconnecting that portion of the second resistive ladder network of said first stage across the first ladder network of said second stage whereby said selected levels of said plurality of voltages between which said input signal falls is supplied to said second stage, and means coupled to each stage of said converter to derive a digital output representative of said analog input signal.

2. A plural stage analog-to-digital converter as defined in claim 1 wherein the resistors employed in said first and second resistive ladder networks of said stages of said converter are arranged in quadratic fashion such that said means coupled to each stage of said converter derives a digital output representative of the square of said analog input signal.

3. A plural stage analog-to-digital converter as defined in claim 1 wherein each of said comparators of said first stage has a pair of input terminals and a pair of output terminals with one input terminal of each comparator being operatively connected to said first ladder network of said first stage such that a voltage of predetermined magnitude is applied to each of said comparators, the other input terminal of each of said comparators being adapted for connection to said input analog signal.

4. A plural stage analog-to-digital converter as defined in claim 3 wherein said first means of said first stage comprises a plurality of AND gate devices, each of said AND gate devices having a pair of input terminals and an output terminal with the input of each AND gate device being operatively connected to an adjacent pair of comparators such that each one of the pair of output terminals of each of said comparators is connected to one of the input terminals of an adjacent pair of AND gate devices.

5. A plural stage analog-to-digital converter as defined in claim 4 wherein said second means of said first stage comprises a plurality of gate devices, each of said gate devices having a pair of input terminals and an output terminal with one input terminal of each adjacent gate device being operatively connected to said second resistive ladder network of said first stage and the other input terminal of each adjacent pair of said gate devices being connected to the output terminal of one of said AND gate devices such that an output signal appearing on the output of any of said AND gate devices is operative to enable an adjacent pair of said gate devices and interconnect that portion of the second resistive ladder network of said first stage across the first ladder network of said second stage.

6. A plural stage analog-to-digital converter as defined in claim 5 wherein the resistors employed in said first and second resistive ladder networks of said stages of said converter are arranged in quadratic fashion such that said means coupled to each stage of said converter derives a digital output representative of the square of said analog input signal.